(12) United States Patent
Kim et al.

(10) Patent No.: US 9,601,500 B2
(45) Date of Patent: Mar. 21, 2017

(54) ARRAY OF NON-VOLATILE MEMORY CELLS WITH ROM CELLS

(71) Applicant: Silicon Storage Technology, Inc., San Jose, CA (US)

(72) Inventors: Jinho Kim, Saratoga, CA (US); Vipin Tiwari, Dublin, CA (US); Nhan Do, Saratoga, CA (US); Xian Liu, Sunnyvale, CA (US); Xiaozhou Qian, Shanghai (CN); Ning Bai, Shanghai (CN); Kai Man Yue, Shanghai (CN)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 14/639,063

(22) Filed: Mar. 4, 2015

(65) Prior Publication Data

US 2016/0254269 A1    Sep. 1, 2016

(30) Foreign Application Priority Data

Feb. 27, 2015  (CN) .......................... 2015 1 0089866

(51) Int. Cl.
*H01L 27/115* (2006.01)
*H01L 29/423* (2006.01)
*H01L 29/788* (2006.01)

(52) U.S. Cl.
CPC .. *H01L 27/11524* (2013.01); *H01L 29/42328* (2013.01); *H01L 29/788* (2013.01)

(58) Field of Classification Search
CPC .................... H01L 27/11524; H01L 29/42328

USPC .................................................. 257/315–319
See application file for complete search history.

(56) References Cited

U.S. PATENT DOCUMENTS

| | | | |
|---|---|---|---|
| 5,925,917 A * | 7/1999 | Maari | H01L 27/112 257/314 |
| 6,259,132 B1 | 7/2001 | Pio | |
| 6,747,310 B2 | 6/2004 | Fan et al. | |
| 7,927,994 B1 | 4/2011 | Liu et al. | |
| 2007/0158737 A1 | 7/2007 | Yang | |
| 2014/0264540 A1* | 9/2014 | Tan | H01L 45/1226 257/320 |

(Continued)

FOREIGN PATENT DOCUMENTS

| TW | 201036150 | 10/2010 |
|---|---|---|
| TW | 201445706 | 12/2014 |

*Primary Examiner* — Kenneth Parker
*Assistant Examiner* — Warren H Kilpatrick
(74) *Attorney, Agent, or Firm* — DLA Piper LLP (US)

(57) ABSTRACT

A memory device that includes a plurality of ROM cells each having spaced apart source and drain regions formed in a substrate with a channel region therebetween, a first gate disposed over and insulated from a first portion of the channel region, a second gate disposed over and insulated from a second portion of the channel region, and a conductive line extending over the plurality of ROM cells. The conductive line is electrically coupled to the drain regions of a first subgroup of the ROM cells, and is not electrically coupled to the drain regions of a second subgroup of the ROM cells. Alternately, a first subgroup of the ROM cells each includes a higher voltage threshold implant region in the channel region, whereas a second subgroup of the ROM cells each lack any higher voltage threshold implant region in the channel region.

6 Claims, 9 Drawing Sheets

(56) References Cited

U.S. PATENT DOCUMENTS

2015/0145060 A1\* 5/2015 Zhou ................ H01L 29/45
257/384
2015/0187783 A1\* 7/2015 Chuang ............ H01L 21/31111
257/314

\* cited by examiner

ARRAY OF NON-VOLATILE MEMORY CELLS WITH ROM CELLS

FIELD OF THE INVENTION

The present invention relates to non-volatile memory cell arrays, and more particularly to such arrays that include read-only memory cells.

BACKGROUND OF THE INVENTION

Figure 1:
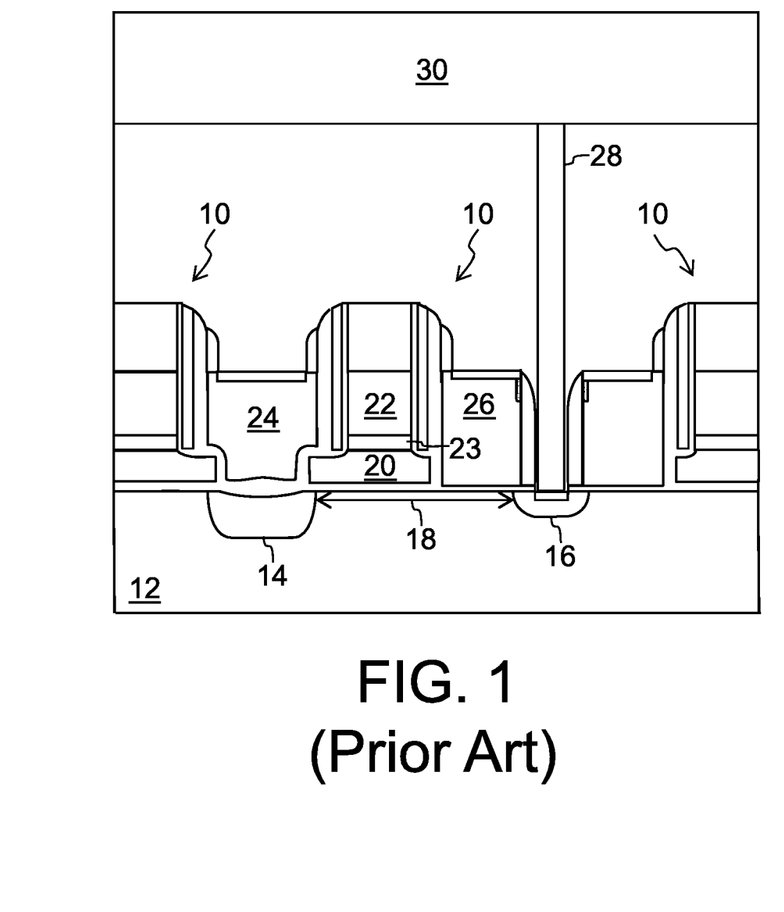
FIG. 1 is a side cross sectional view of a conventional non-volatile memory cell.

Split gate non-volatile memory devices are well known in the art. For example, U.S. Pat. Nos. 6,747,310 and 7,927,994 disclose a split gate non-volatile memory (NVM) cell, which are incorporated herein by reference for all purposes. FIG. 1 illustrates an example of such conventional split gate memory cells 10 formed on a semiconductor substrate 12. Source and drain regions 14 and 16 are formed as diffusion regions in silicon substrate 12, and define a channel region 18 therebetween. Each memory cell 10 includes four conductive gates: a floating gate 20 disposed over and insulated from a first portion of the channel region 18 and a portion of the source region 14, a control gate 22 disposed over and insulated from the floating gate 20 by insulation layer 23, an erase gate 24 disposed over and insulated from the source region 14, and a select gate 26 (commonly referred to as the word line gate) disposed over and insulated from a second portion of the channel region 18. A conductive contact 28 electrically connects the drain region 16 to a conductive bit line 30, that electrically connects to all the drain regions in the column of memory cells 10. The memory cells 10 are formed in pairs that share a common source region 14 and erase gate 24. Adjacent pairs of memory cells share a common drain region 16 and conductive contact 28. Typically, the memory cell pairs are formed in an array of rows and columns of the memory cells 10.

Memory cells 10 are programmed by injecting electrons onto the floating gate 20. The negatively charged floating gate 20 causes a reduced or zero conductivity in the underlying channel region 18, which is read as a "0" state. Memory cells 10 are erased by removing the electrons from the floating gate 20, which allows the underlying channel region to conduct when the corresponding select gate 26 and control gate 22 are raised to their reading voltage potentials. This is read as a "1" state. Memory cells 10 can be repeatedly programmed, erased and re-programmed.

There are applications where read only memory (ROM) is formed on the same chip as the NVM array. ROM includes memory cells that are only programmable once, and thereafter cannot be erased or re-programmed. ROM is formed on the same chip as the NVM array to provide code that cannot be changed. For many such applications, the code needs to be secure (i.e. once programmed, the user or hacker should not be able to change it or hack it). The NVM cells are not appropriate for storing this secure code, because the user could accidentally program code over this secure code, or it could be hacked by those with malicious intentions. One solution has been to provide a dedicated ROM structure that is separate from, but on the same chip as, the NVM array. However, such a dedicated structure is easily identifiable and therefore subject to the same hacking threat. Moreover, forming dedicated ROM structures requires separate processing and masking steps relative to the NVM array, which can drive up the complexity and the cost of manufacturing the chip.

There is a need for implementing ROM on the same chip as NVM which is secure and which does not require excessive processing to fabricate.

BRIEF SUMMARY OF THE INVENTION

The aforementioned problems and needs are addressed with a memory device that includes a plurality of ROM cells each having spaced apart source and drain regions formed in a substrate, with a channel region therebetween, a first gate disposed over and insulated from a first portion of the channel region, a second gate disposed over and insulated from a second portion of the channel region, and a conductive line extending over the plurality of ROM cells. The conductive line is electrically coupled to the drain regions of a first subgroup of the plurality of ROM cells, and is not electrically coupled to the drain regions of a second subgroup of the plurality of ROM cells.

A memory device includes a plurality of ROM cells each having spaced apart source and drain regions formed in a substrate, with a channel region therebetween, a first gate disposed over and insulated from a first portion of the channel region, and a second gate disposed over and insulated from a second portion of the channel region. For each of a first subgroup of the plurality of ROM cells, the ROM cell includes a higher voltage threshold implant region in the channel region, and for each of a second subgroup of the plurality of ROM cells, the ROM cell lacks any higher voltage threshold implant region in the channel region.

Other objects and features of the present invention will become apparent by a review of the specification, claims and appended figures.

DETAILED DESCRIPTION OF THE INVENTION

The present invention is a technique that integrates ROM within the non-volatile memory (NVM) array using the same basic structures as the NVM cells, such that the ROM is not easily distinguishable or identifiable from the NVM array by potential hackers. The technique is easily manufactured because it involves easy to implement changes to the existing memory cells within the array.

Figure 2:
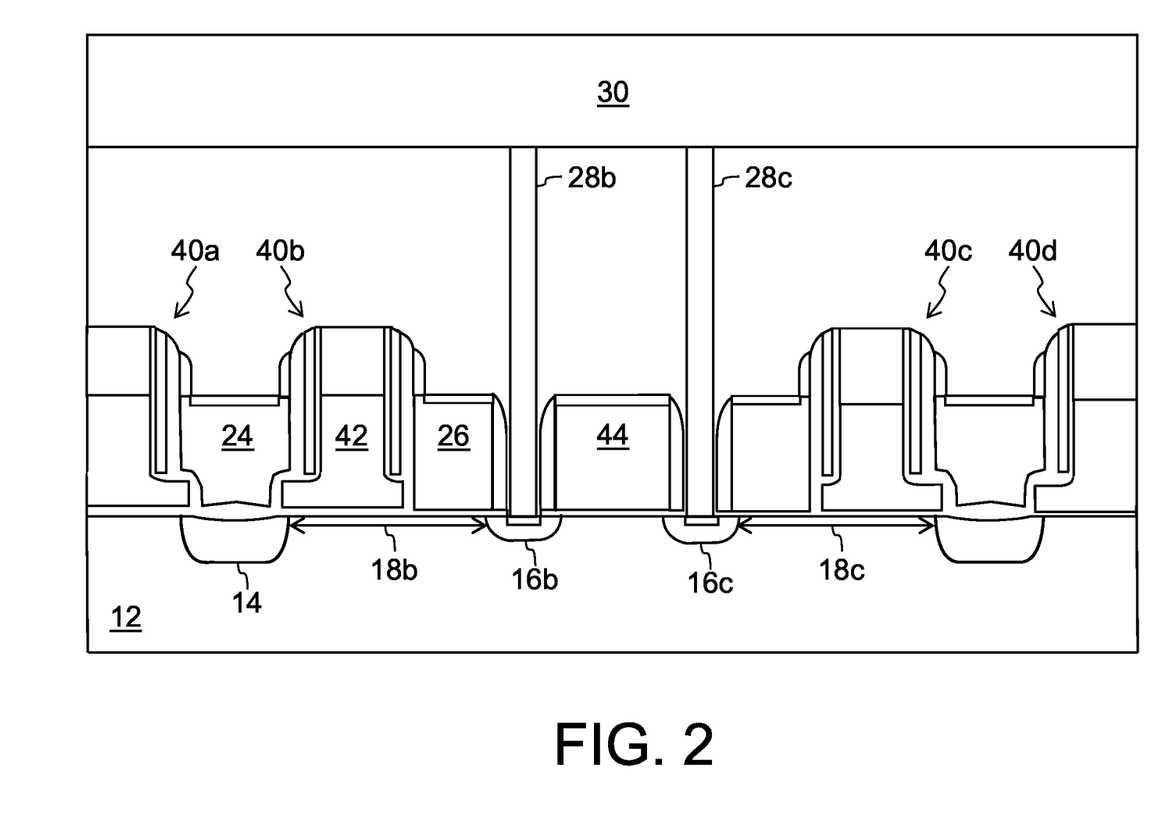
FIG. 2 is a side cross sectional view of ROM cells showing ROM cells programmed with intact bit line contacts.

FIG. 2 illustrates ROM cells 40a, 40b, 40c and 40d, which can be embedded anywhere in an array of the above described NVM cells 10. Each ROM cell has the same components as the above described memory cells 10, except that insulation 23 is omitted such that floating gate 20 and control gate 22 are integrally formed as a single control gate 42 (i.e. no floating gate). Additionally, each ROM cell does not share drain region 16 or contact 28 with the adjacent ROM cell, but rather each ROM cell has its own drain region 16 and contact 28. Lastly, a dummy gate 44 is formed between the drain regions 16 of adjacent ROM cells.

Figure 3:
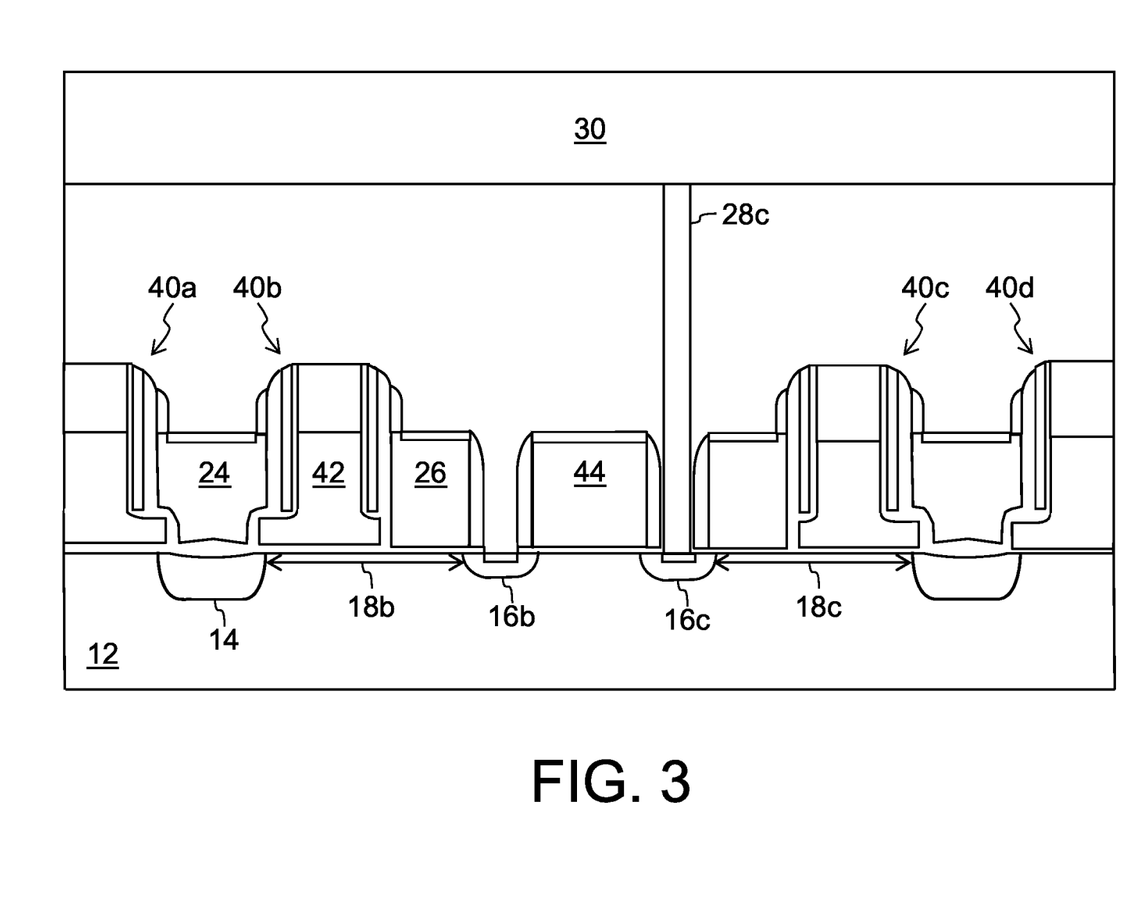
FIG. 3 is a side cross sectional view of ROM cells showing a ROM cell programmed with a missing bit line contact.

Taking ROM cell 40b as an example, when gates 42 and 26 of that cell are raised to their reading voltage potentials, channel region 18b will always be rendered conductive between source 14 and drain 16b, which is read as a "1" state. Therefore, ROM cell 40b will always read as a "1" state by detected current flow from source region 14, through channel region 18b, drain 16b, drain contact 28b and to bit line 30). This "1" state is determined and fixed (i.e. not changeable later) at the time of fabrication. In contrast, if it is desired that ROM cell 40b always reads as a "0" state, then it would be fabricated with the configuration shown in FIG. 3, which is the same configuration as that shown in FIG. 2, except that the drain contact 28b would be omitted during the fabrication process. When gates 42 and 26 of ROM cell 40b are raised to their reading voltage potentials, channel region 18b will always be rendered conductive between source 14 and drain 16b, but that conductivity is broken by the lack of any contact between drain 16b and bit line 30. Thus, ROM cell 40b with this configuration will always read as a "0" state (i.e. no detected current flow between source region 14 and bit line 30). To ensure there is no leakage current to the adjacent bit line 16c and bit line contact 28c for the adjacent ROM cell 40c, dummy gate 44 is held at zero volts (or a positive or negative voltage that is less than the subthreshold voltage) to ensure that the silicon underneath gate 44 is not conductive. Therefore, as shown in FIG. 3, ROM cell 40b will always read as a "0" state, while ROM cell 40c (which has a bit line contact 28c) would always read as a "1" state. Said another way, the programming state of ROM cells 40 is dictated by including, or not including, the corresponding bit line contact 28 during fabrication.

There are many advantages of the ROM cell configurations of FIGS. 2 and 3. First, the bit state "1" or "0" for any given ROM cell is set during fabrication by forming or by not forming the bit line contacts 28 for that cell. The bit state cannot be subsequently changed. Moreover, because the ROM cell structure is so similar to the non-volatile memory cells, the ROM cells can be easily fabricated at the same time as the non-volatile memory cell array (i.e. very similar process flows, only one additional masking step). Preferably, the masking step used to form the contacts 28 for the ROM and NVM cells dictates which ROM cells will include a contact 28 and which will not. The ROM cells 40 can be formed either adjacent to or even inside the NVM array of memory cells 10. Also, because the ROM cells 40 are so similar to the NVM cells 10, it would be very difficult to distinguish the two types of cells when they are formed in the same array, making hacking difficult.

Figure 4:
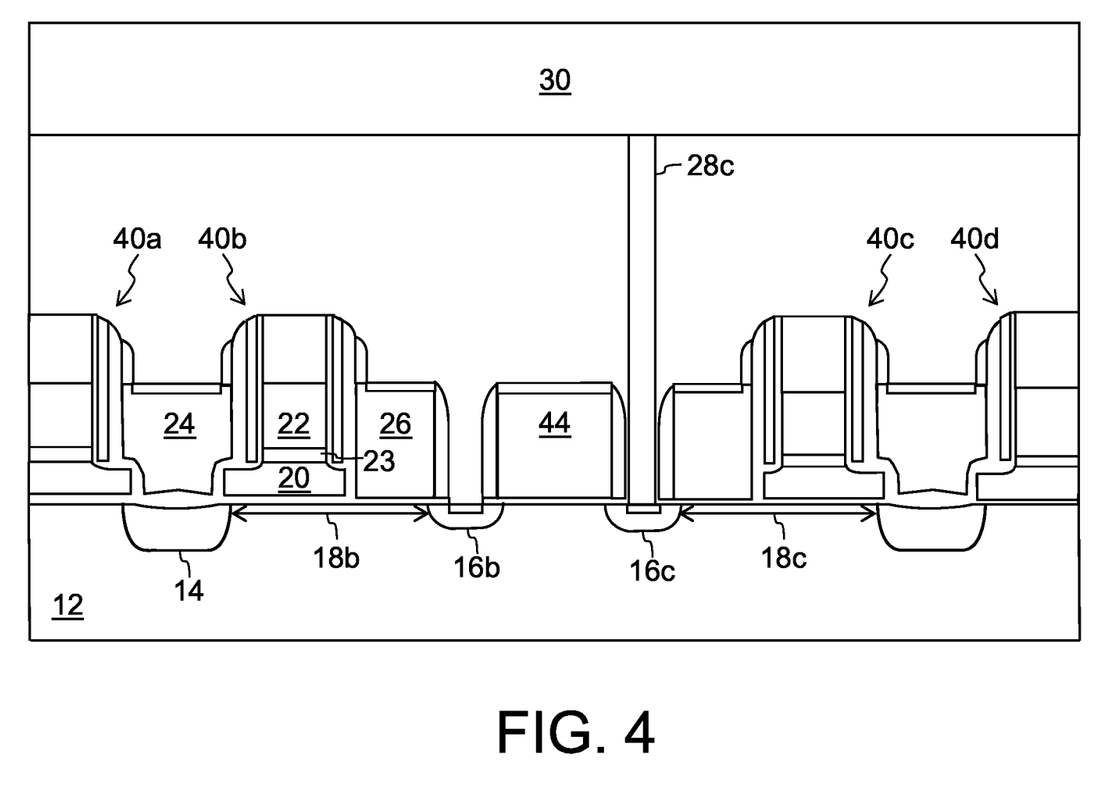
FIGS. 4-9 are side cross sectional views of alternate embodiments of the ROM cells of the present invention.

FIG. 4 illustrates an alternate embodiment, where the ROM cells 40 are even closer in design to the NVM cells 10. Specifically, in this embodiment, the insulation layer 23 is maintained such that each ROM cell 40 includes separate floating and control gates 20 and 22. ROM cells 40 are read in this configuration by raising control gate 22 to a high enough voltage such that, through voltage coupling to the floating gate 20, the channel region under the floating gate 20 is conductive. As shown in FIG. 4, ROM cell 40b would read as a "0" state (because of the missing contact 28) and ROM cell 40c would read as a "1" state (because of the existing contact 28c).

Figure 5:
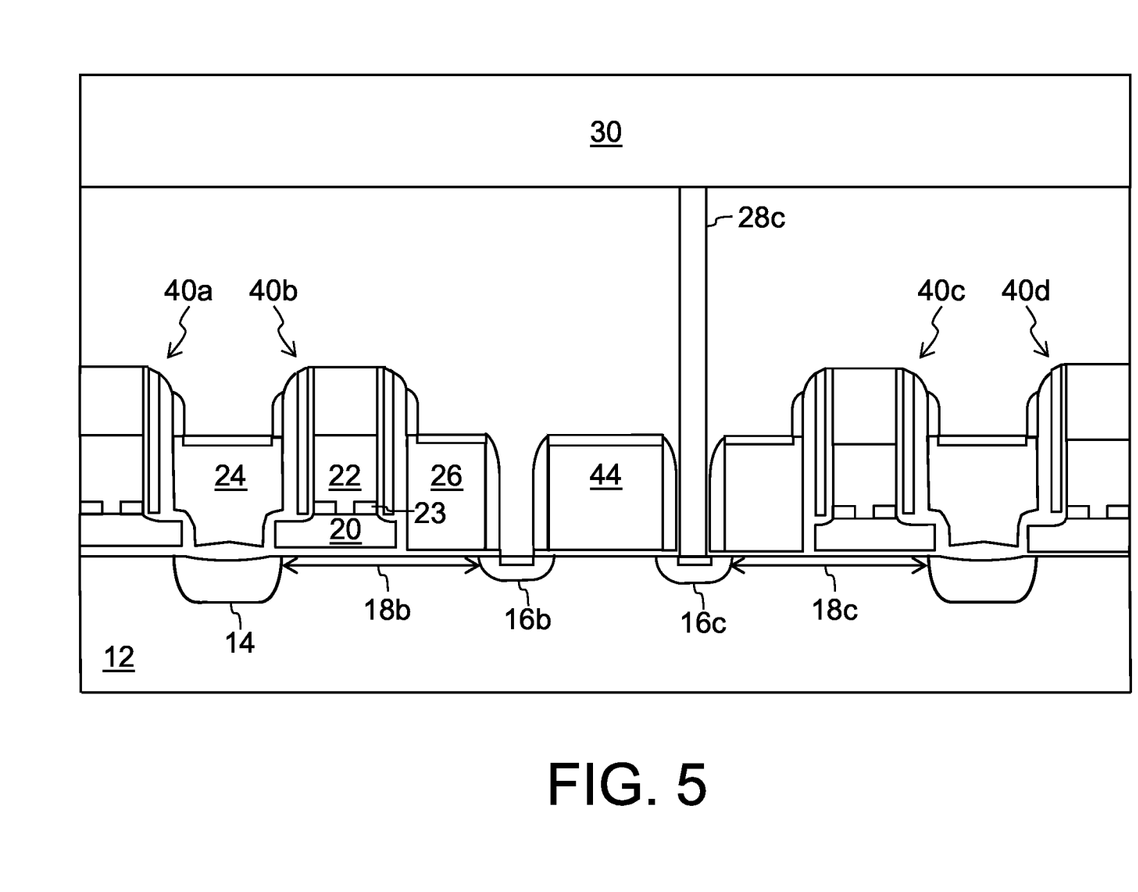

FIG. 5 illustrates another alternate embodiment, which is the same as FIG. 4 except that a hole in layer 23 is formed such that a portion of control gate 22 is in electrical contact with the floating gate 20.

Figure 6:
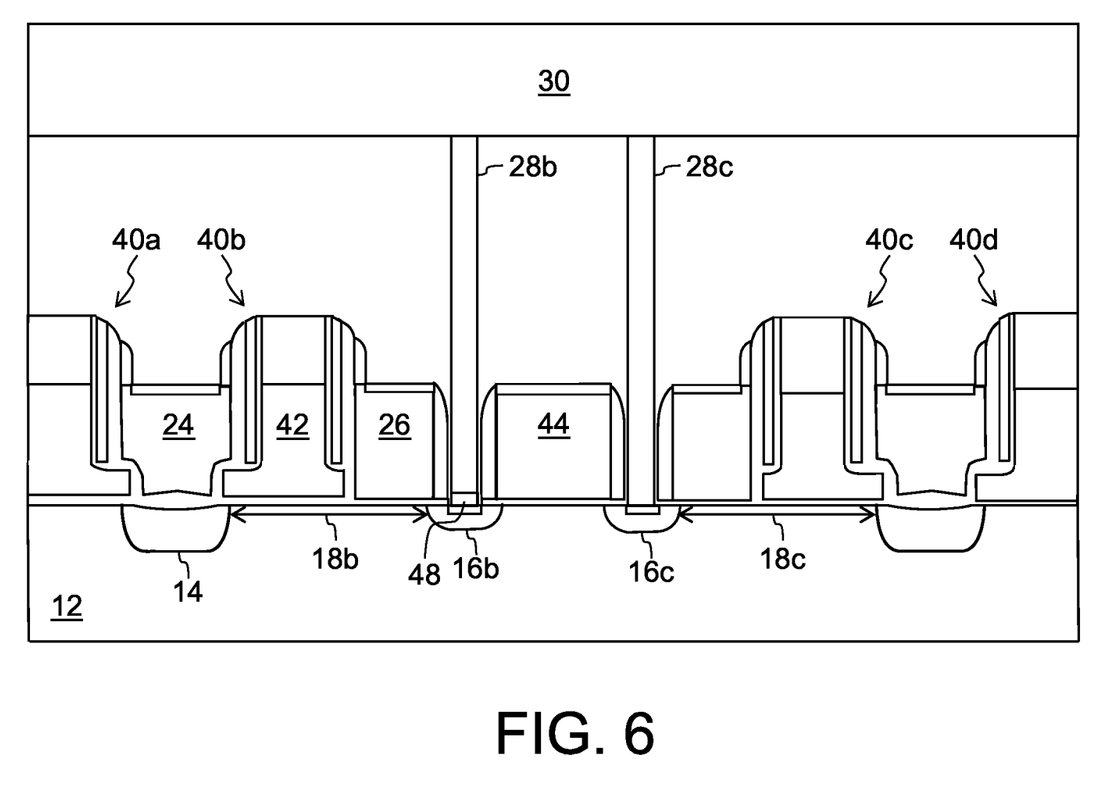

FIG. 6 illustrates another alternate embodiment, which is the same as FIGS. 2 and 3, except that instead of programming ROM cell 40b in the "0" state by omitting drain contact 28b, a layer of insulation 48 can be formed over drain 16b so that contact 28b is not in electrical contact with drain 16b. This same technique can be implemented in the embodiments of FIGS. 4 and 5. Insulation 48 can be selective formed by forming it over all the drain regions 16, followed by a mask and etch process that selectively removes the insulation 48 from the drain regions 16 of those ROM cells that are to be in the "1" state.

Figure 7:
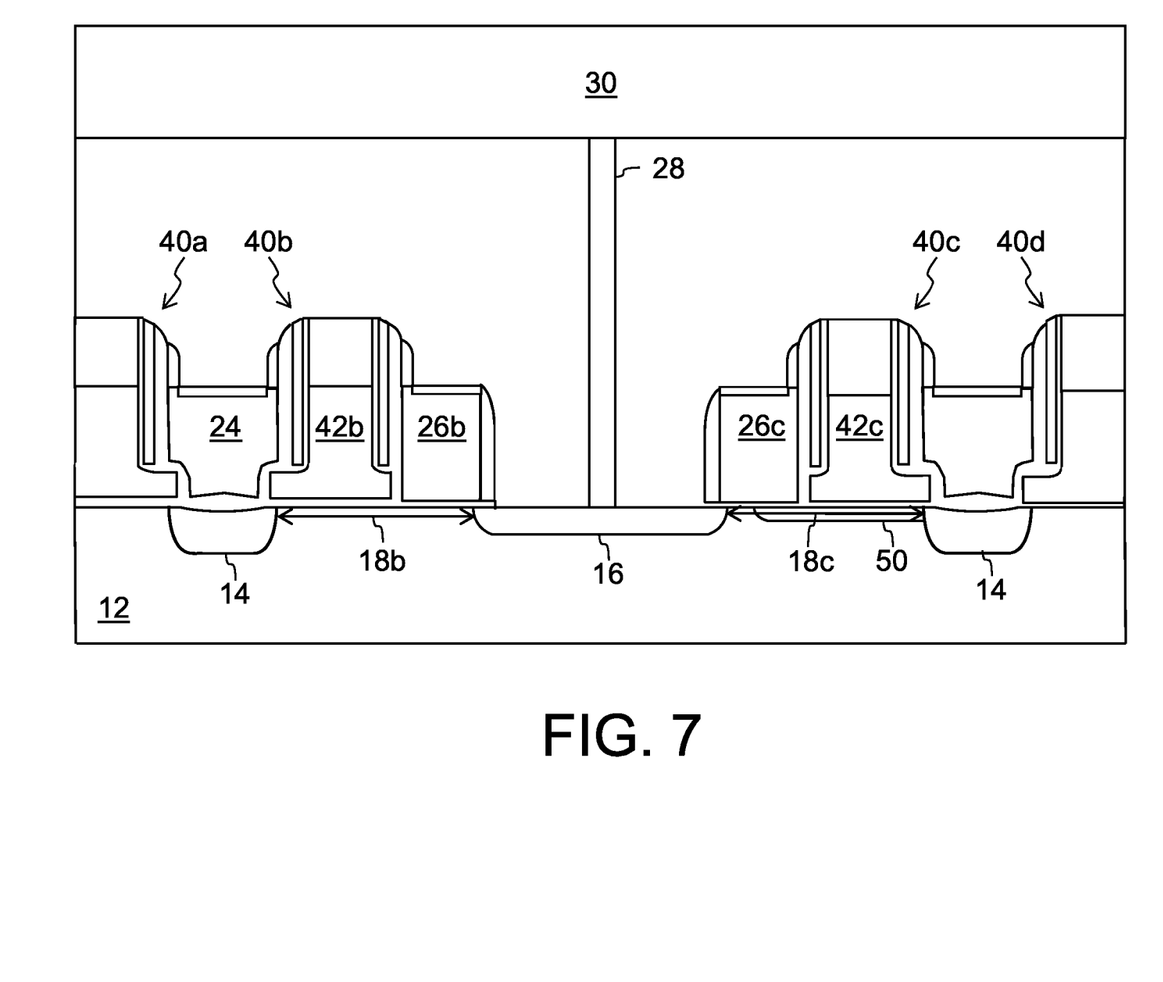

FIG. 7 illustrates still another alternate embodiment, where ROM cells are programmed through selective substrate implantation instead of selective bit line contact formation. This embodiment is similar to that shown in FIG. 4, except there is no dummy gate 44, and adjacent memory cells share a common drain 16 and bit line contact 28 (similar to the NVM cell configuration). Instead of programming the ROM cells based upon the existence or non-existence of the bit line contact 28, the ROM cells are programmed by the existence or non-existence of channel region implantation. Specifically, as shown, ROM cell 40c includes a higher threshold voltage implant region 50 in channel region 18c. The implant region 50 has a higher threshold voltage (Vt) required to make the channel 18c conduct relative to the channel regions without the implant 50. The threshold voltage Vt of implant region 50 is greater than the read voltages applied to select and control gates 26 and 46. Therefore, during the read operation of ROM cell 40c, when read voltages are applied to select gate 26c and control gate 42c, channel region 18c will not conduct due to implant region 50, indicating that ROM cell 40c is configured in the "0" state. In contrast, during the read operation of ROM cell 40b, raising select gate 26b and control gate 42b to their reading potentials results in current flow through channel region 18b, indicating that ROM cell 40b is configured in the "1" state. Implant region 50 can be disposed under the select gate 26, under the control gate 42, or at least partially under both as shown. Preferably, implant region 50 extends from source region 14 toward drain region 16, but does not extend all the way to drain region 16 to improve the break down voltage and lower the junction capacitance. Because the ROM programming is implemented by substrate implantation, it is difficult to detect the programmed code by reverse engineering. The top view structure is identical with that of the NVM cell structure, so it is very difficult to recognize where the ROM cells are located.

Figure 8:
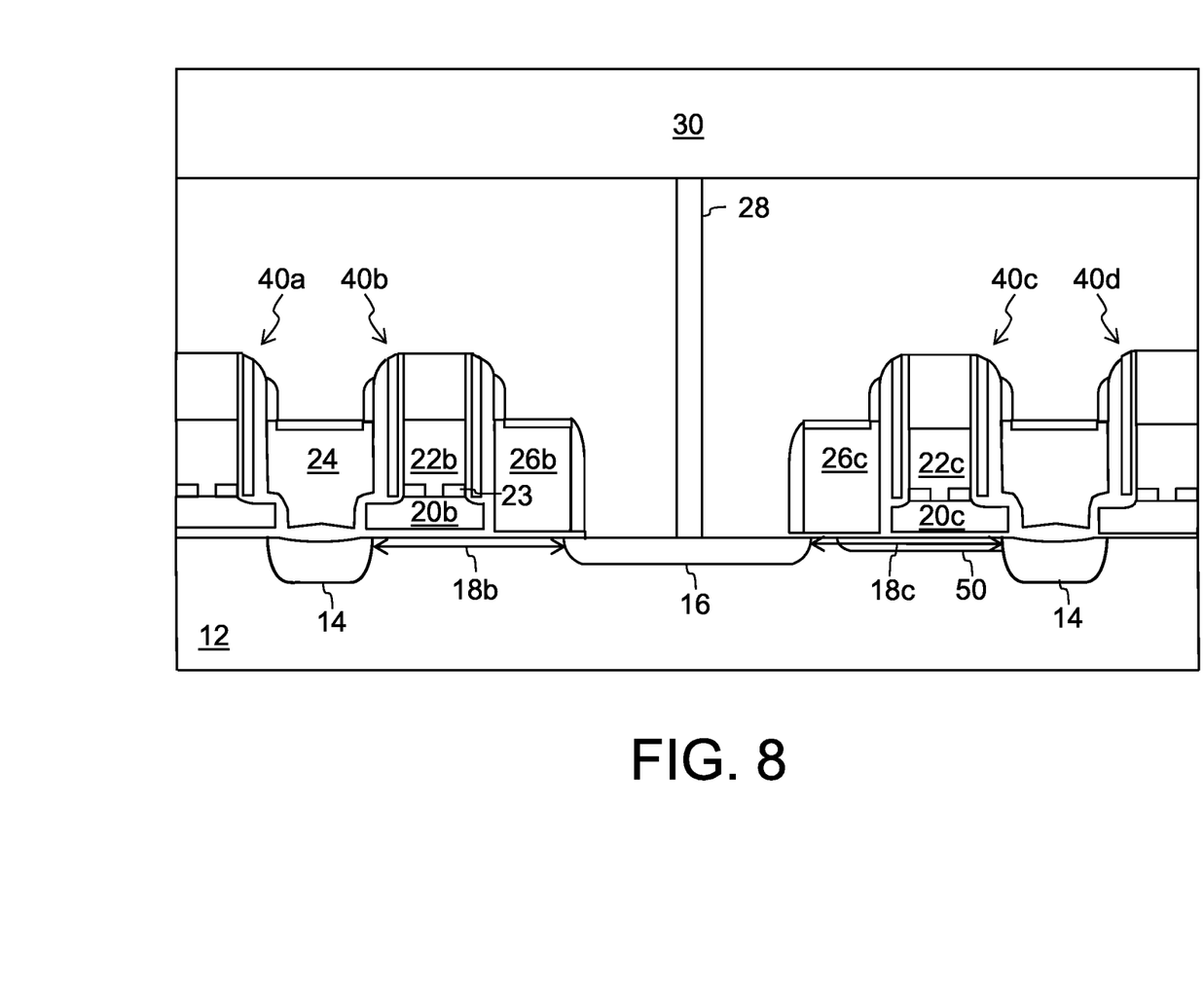

FIG. 8 illustrates still another alternate embodiment, which is similar to that in FIG. 7, except the insulation layer 23 is maintained such that each ROM cell 40 includes separate floating and control gates 20 and 22. A hole in layer 23 is formed such that a portion of control gate 22 is in electrical contact with the floating gate 20.

Figure 9:
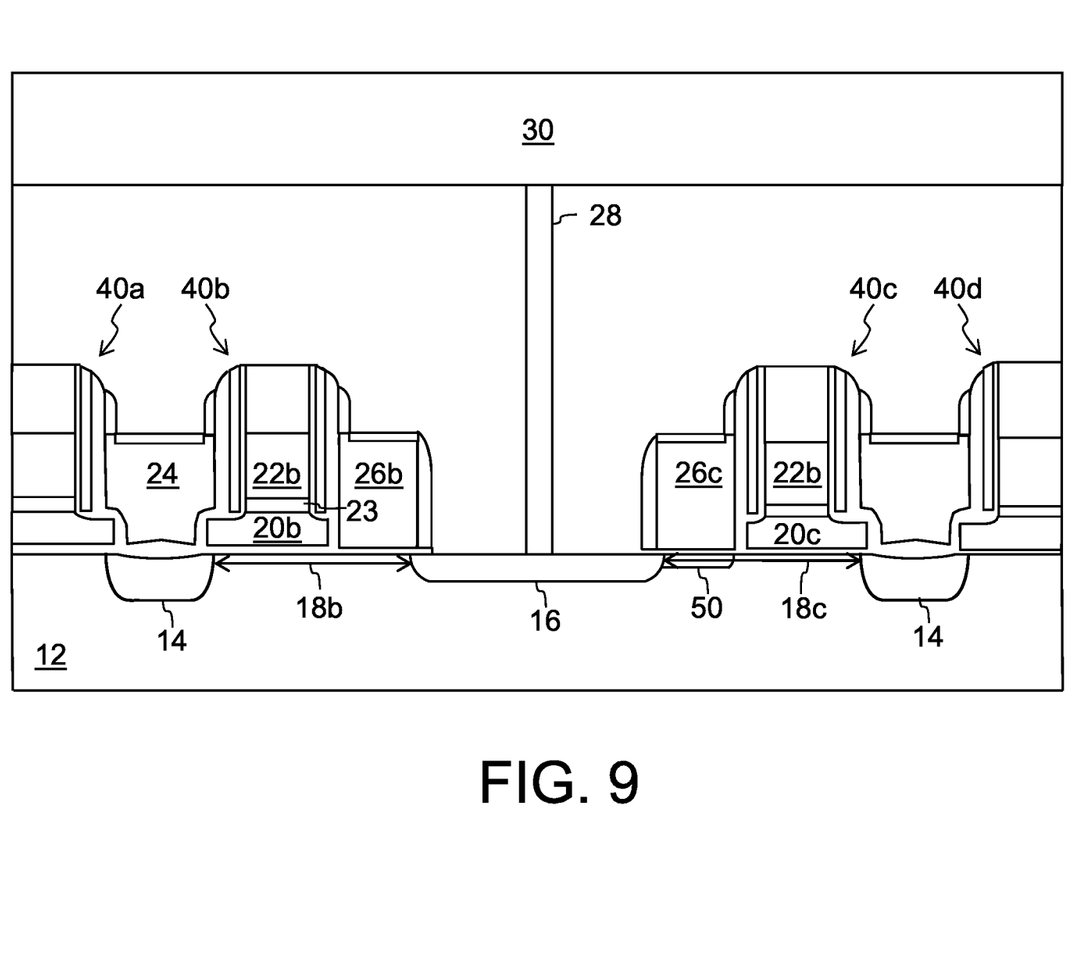

FIG. 9 illustrates still another alternate embodiment, which is similar to that in FIG. 7, except the insulation layer 23 is maintained such that each ROM cell 40 includes separate floating and control gates 20 and 22 which are insulated from each other. Further, the implant region 50 is formed under just the select gate 26 (and not under floating gate 20). In this configuration, the floating cells 20 remain unprogrammed (i.e. no electrons injected thereon) such that the channel regions under the floating gates 20 are conductive. Therefore, during the read operation of ROM cell 40c, when a read voltage is applied to select gate 26c, channel region 18c will not conduct due to implant region 50, indicating that ROM cell 40c is configured in the "0" state. In contrast, during the read operation of ROM cell 40b, raising select gate 26b to its reading potentials results in current flow through channel region 18b, indicating that ROM cell 40b is configured in the "1" state.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Those skilled in the art understand that the source and drain regions are interchangeable. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A memory device comprising:
    a semiconductor substrate;
    a plurality of ROM cells, wherein each of the ROM cells comprises:
        spaced apart source and drain regions formed in the substrate, with a channel region therebetween,
        a first gate disposed over and insulated from a first portion of the channel region,
        a second gate disposed over and insulated from a second portion of the channel region,
        wherein for each of a first subgroup of the plurality of ROM cells, the ROM cell includes a higher voltage threshold implant region in the channel region; and
        wherein for each of a second subgroup of the plurality of ROM cells, the ROM cell lacks any higher voltage threshold implant region in the channel region; and
    a plurality of NVM cells, wherein each of the NVM cells comprises:
        spaced apart second source and second drain regions formed in the substrate, with a second channel region therebetween,
        a floating gate disposed over and insulated from a first portion of the second channel region,
        a select gate disposed over and insulated from a second portion of the channel region.

2. The memory device of claim 1, wherein each of the NVM cells further comprises:
    a control gate disposed over and insulated from the floating gate; and
    an erase gate disposed over and insulated from the second source region.

3. The memory device of claim 1, wherein for each of the first subgroup of the plurality of ROM cells, the higher voltage threshold implant region extends from the source region toward, but does not reach, the drain region.

4. The memory device of claim 1, wherein each of the ROM cells further comprises:
    a third gate disposed over and electrically coupled to the first gate.

5. The memory device of claim 1, wherein each of the ROM cells further comprises:
    a third gate disposed over and insulated from the first gate.

6. The memory device of claim 5, wherein for each of the second subgroup of the plurality of ROM cells, the higher voltage threshold implant region is disposed under the second gate.

* * * * *